(12) United States Patent
Nagimov

(10) Patent No.: US 12,457,680 B2
(45) Date of Patent: Oct. 28, 2025

(54) CIRCUIT BOARD COOLING CONFIGURATIONS

(71) Applicant: Microsoft Technology Licensing, LLC, Redmond, WA (US)

(72) Inventor: Ruslan Nagimov, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 278 days.

(21) Appl. No.: 18/120,900

(22) Filed: Mar. 13, 2023

(65) Prior Publication Data

US 2024/0314917 A1   Sep. 19, 2024

(51) Int. Cl.
H05K 1/02   (2006.01)
H05K 7/20   (2006.01)

(52) U.S. Cl.
CPC ......... *H05K 1/0203* (2013.01); *H05K 1/0212* (2013.01); *H05K 7/20372* (2013.01); H05K 2201/064 (2013.01); H05K 2201/09063 (2013.01)

(58) Field of Classification Search
CPC ............... H05K 1/0203; H05K 1/0212; H05K 7/20372; H05K 2201/064; H05K 2201/09063; H05K 2201/09072; H05K 2201/09081; H05K 1/0204; H05K 7/20254; H05K 7/20272; H01L 23/36; H01L 23/427; H01L 23/445; G06F 2200/201; G06F 1/20

See application file for complete search history.

(56) References Cited

U.S. PATENT DOCUMENTS

| | | | | |
|---|---|---|---|---|
| 4,859,808 A | * | 8/1989 | Jeter | H01L 23/49572 257/E21.511 |
| 4,980,754 A | * | 12/1990 | Kotani | H01L 23/445 257/725 |
| 5,831,489 A | * | 11/1998 | Wire | H05K 9/0075 361/728 |
| 6,049,122 A | * | 4/2000 | Yoneda | H01L 21/563 257/737 |
| 7,005,585 B2 | * | 2/2006 | Ishizaki | H01L 24/32 257/E21.503 |
| 7,474,006 B2 | * | 1/2009 | Maeda | H01L 24/16 257/737 |
| 10,304,787 B2 | * | 5/2019 | Suzuki | H01L 25/167 |
| 2003/0005711 A1 | | 1/2003 | Goth et al. | |
| 2006/0133040 A1 | | 6/2006 | Belady et al. | |
| 2007/0127210 A1 | | 6/2007 | Mahalingam et al. | |

(Continued)

FOREIGN PATENT DOCUMENTS

EP   1605238 A1   12/2005

OTHER PUBLICATIONS

International Search Report and Written Opinion received for PCT Application No. PCT/US2024/018581, Aug. 1, 2024, 12 pages.

*Primary Examiner* — Michael A Matey
(74) *Attorney, Agent, or Firm* — Rainier Patents, P.S.

(57) ABSTRACT

The discussion relates to thermal management. One example can include a circuit board including inner, intermediate, and outer generally concentric zones and a cryogenically cooled chip located in the inner zone as well as non-cryogenic electronic components positioned in the outer zone. In this example, the intermediate zone can have a skeletonized configuration that slows thermal energy movement from the outer zone to the inner zone.

20 Claims, 14 Drawing Sheets

(56) References Cited

U.S. PATENT DOCUMENTS

| | | |
|---|---|---|
| 2007/0210446 A1 | 9/2007 | Andry |
| 2010/0281884 A1* | 11/2010 | Rawski .................. F25B 21/04 |
| | | 62/3.6 |
| 2011/0075384 A1* | 3/2011 | Yeates .................... H05K 1/189 |
| | | 361/752 |
| 2015/0182966 A1* | 7/2015 | Coursey ............ B01L 3/502715 |
| | | 435/286.1 |
| 2018/0254237 A1 | 9/2018 | Kulkarni et al. |
| 2018/0279503 A1* | 9/2018 | Chow ................ H05K 7/20372 |
| 2020/0042053 A1 | 2/2020 | Cheng et al. |
| 2021/0120668 A1 | 4/2021 | Aoki |
| 2022/0142003 A1* | 5/2022 | Kegel ................ H05K 7/20372 |
| | | 361/679.53 |
| 2022/0248557 A1* | 8/2022 | Manousakis ............ H01L 23/44 |

\* cited by examiner

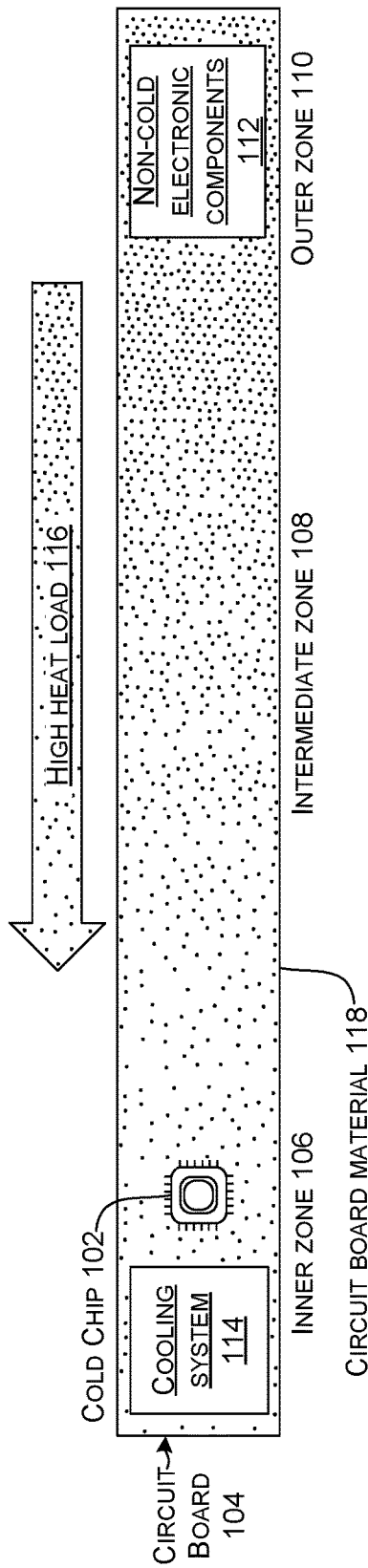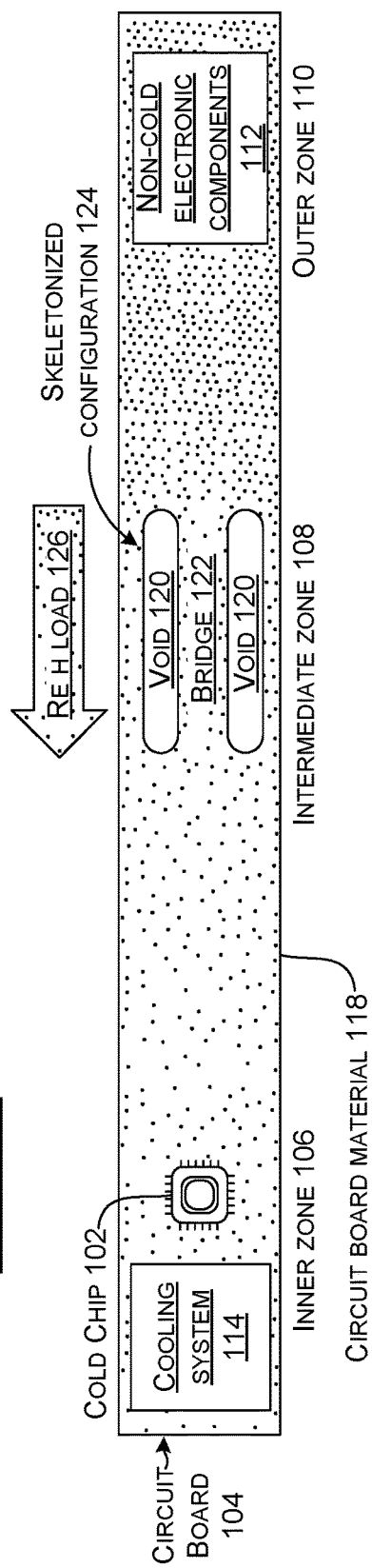

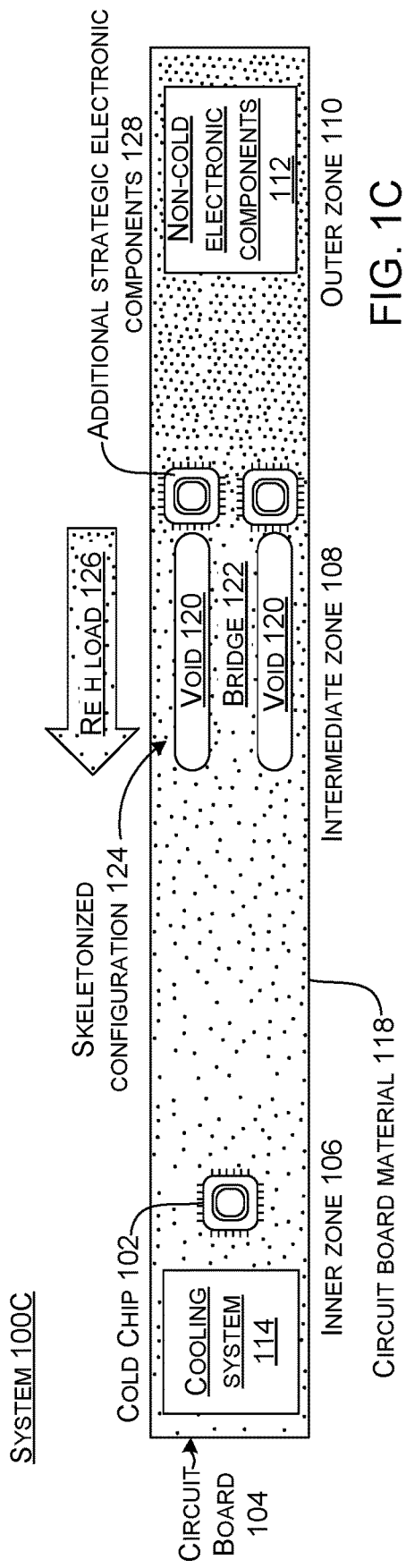
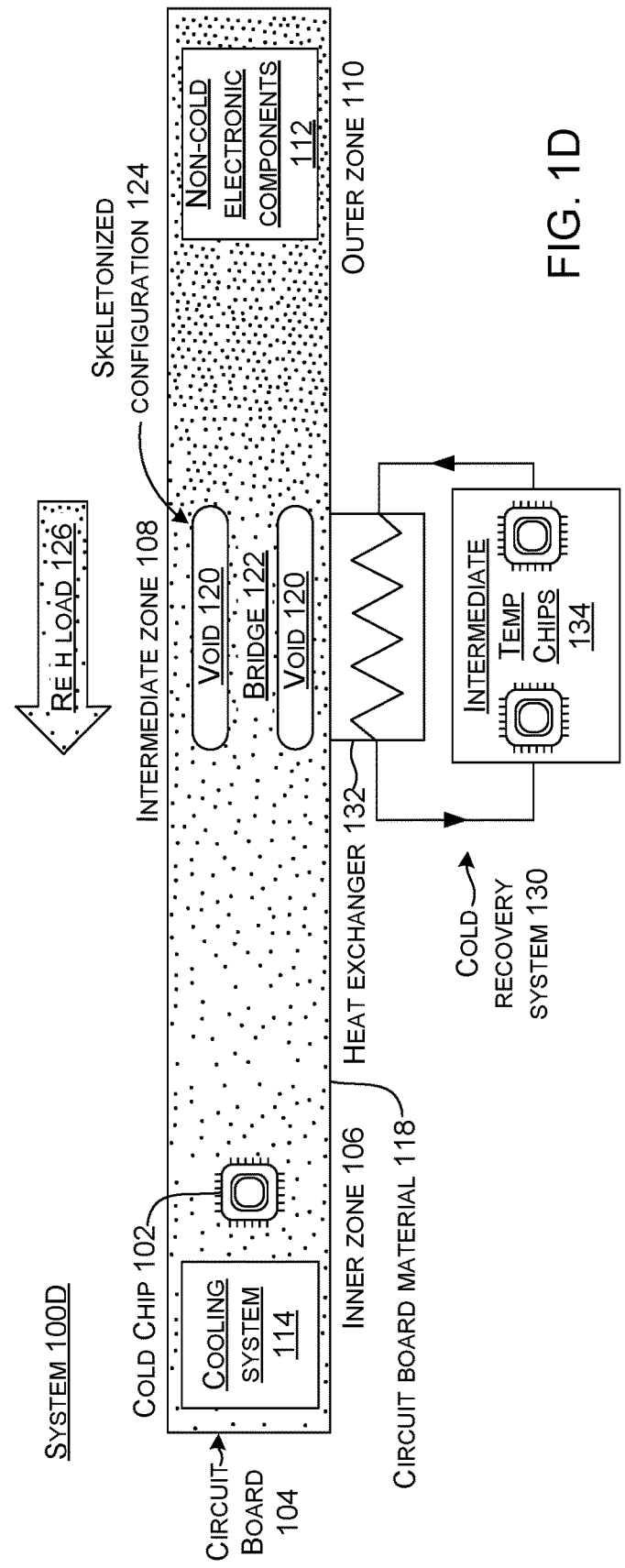

CIRCUIT BOARD COOLING CONFIGURATIONS

BACKGROUND

Circuit boards can include multiple different electronic components. Individual electronic components can generate heat during operation and have specific cooling requirements.

BRIEF DESCRIPTION OF THE DRAWINGS

The accompanying drawings illustrate implementations of the concepts conveyed in the present patent. Features of the illustrated implementations can be more readily understood by reference to the following description taken in conjunction with the accompanying drawings. Like reference numbers in the various drawings are used wherever feasible to indicate like elements. In some cases, parentheticals are utilized after a reference number to distinguish like elements. Use of the reference number without the associated parenthetical is generic to the element. Further, the left-most numeral of each reference number conveys the figure and associated discussion where the reference number is first introduced.

FIGS. 1A-1D are schematic views of example thermal management systems in accordance with some implementations of the present concepts.

DETAILED DESCRIPTION

Figure 2A:
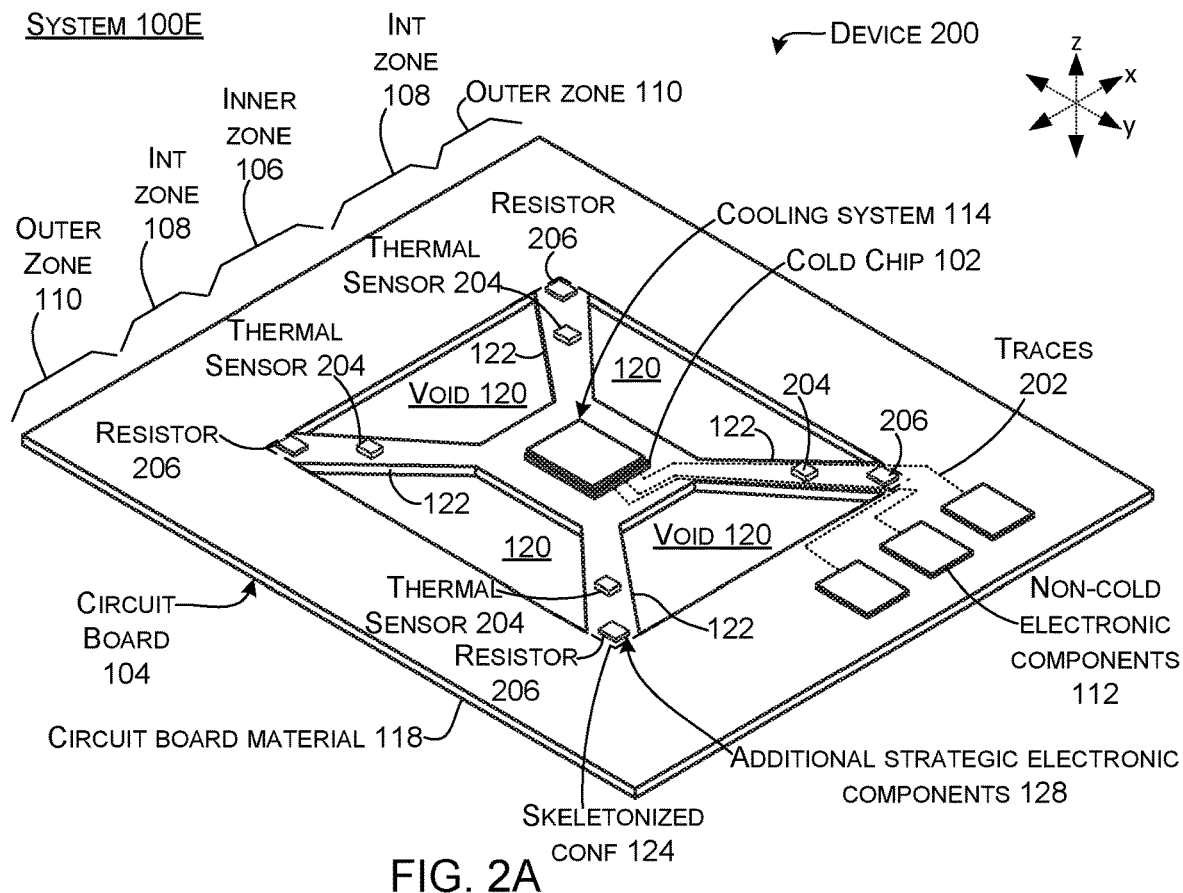
FIGS. 2A, 3, 4, 5A, 5B, 9A, 9B, and 10-12 show perspective views of example thermal management systems in accordance with some implementations of the present concepts.

The present concepts relate to devices, such as computing devices that employ various electronic components. A variety of electronic components may be physically positioned on a substrate, such as a circuit board and interconnected, such as via conductive traces or cables. While operating in proximity to one another the electronic components can have different operational parameters. For instance, some of these 'cold' electronic components, such as various processors may require cold operating temperature ranges. Cooling these cold electronic components to their cold operating temperature ranges may inadvertently damage other 'non-cold' electronic components on the substrate. For instance, the non-cold electronic components may be cooled below the dew point of the ambient air surrounding the circuit board. This condition can cause condensation to form on the non-cold electronic components that can damage them, such as from electrical shorts and/or corrosion. The present concepts provide technical solutions that can reduce thermal migration from the non-cold electronic components to the cold electronic components. For instance, the present concepts can skeletonize the substrate (e.g., the circuit board material) to reduce the rate of thermal migration. These and other aspects are described below.

FIGS. 1A-1D collectively show example systems in which the present thermal management concepts can be implemented. As shown in FIG. 1A, system 100A includes a cold semiconductor chip (hereinafter 'cold chip') 102. The cold chip may be a cryogenic (e.g., cryo) chip. (The use of suffixes 'A,' 'B,' etc. relative to systems 100 is intended to convey that different systems may have different components and/or individual components may be different between systems). The cold chip 102 is configured to operate at low temperatures, such as below −100 C, for example. The cold chip 102 is positioned on a circuit board 104. The circuit board 104 includes an inner zone 106, an intermediate zone 108, and an outer zone 110. The cold chip 102 is positioned on the inner zone 106. Non-cold electronic components 112, such as connectors, ports, memory, etc. can be positioned on the outer zone 110.

The cold chip 102 is cooled by a cooling system 114. The cooling system 114 can remove large amounts of heat from the cold chip 102 and the inner zone 106. In some cases, the cold chip 102 is a cryogenic chip and the cooling system 114 is a cryogenic cooling system while the non-cold electronic components 112 are not cryogenic components. As shown in FIG. 1A, this heat removal can create a large thermal differential and large amounts of heat (e.g., high heat load 116) can flow through circuit board material 118 from the outer zone 110 and the intermediate zone 108 to the inner zone 106. This thermal migration effectively cools the non-cold electronic components 112 to undesirably low temperatures. For instance, the temperature of the non-cold electronic components 112 in the outer zone 110 may drop below the dew point of ambient air around the non-cold electronic components 112. This can result in water condensing on the non-cold electronic components 112. The water may even freeze on the non-cold electronic components 112. In either case, the condensed water can damage the non-cold electronic components 112, such as from electrical shorting and/or corrosion, among others.

Note that while descriptive terms such as "cold," "non-cold," and "cryogenic" are introduced above for purposes of explanation, the present concepts apply to any scenario or system where the cooling of components on the inner zone 106 can cause components on the outer zone 110 to be cooled below the dew point or otherwise cause condensation to form on the components of the outer zone. For instance, in a scenario where the ambient temperature is approximately standard temperature (20 degrees Celsius at standard pressure), such as within plus or minus ten degrees, the cold chip 102 of the inner zone 106 can have a designed operating temperature below standard temperature and the non-cold electronic components 112 of the outer zone 110 can have designed operating temperatures above standard temperature. The present concepts can maintain this temperature delta and can keep the cold chip within its operating temperature while keeping the non-cold electronic components 112 above standard temperature and hence above the dew point.

FIGS. 1B-1D show technical solutions to the above-described issues that slow heat transfer from the outer zone 110 to the inner zone 106 and thereby reduce damage to the non-cold electronic components 112 of the outer zone 110.

FIG. 1B shows system 100B where in the intermediate zone 108, some circuit board material 118 is removed to form voids 120. The remaining circuit board material around the voids can be viewed as bridges 122 of circuit board material. Taken collectively, the voids 120 and bridges 122 can be viewed as defining a skeletonized configuration 124 to the intermediate zone 108. The voids 120 can be occupied by ambient gases (e.g., air) or can be filled with insulative materials, such as foam. The voids 120 have lower thermal conductivity than the circuit board material 118. Introduction of the voids 120 results in a reduced heat load (e.g., reh load) 126 through the intermediate zone 108 compared to the high heat load 116 of FIG. 1A. Stated another way, the introduction of the voids 120 slows/reduces cooling of the outer zone 110 and the non-cold electronic components 112 located on/in the outer zone.

FIG. 1C shows system 100C that is similar to system 100B of FIG. 1B. System 100C introduces additional strategic electronic components 128. The additional strategic electronic components 128 can be electronic components, such as resistors or transformers, for instance, that generate enough heat that they will not be subject to condensation issues. The additional strategic electronic components 128 can be located at the border between the outer zone 110 and the intermediate zone 108.

The additional strategic electronic components 128 can be selected from the non-cold electronic components 112 that would otherwise be positioned on the circuit board 104 to achieve a functionality. For instance, the non-cold electronic components 112 could include integrated circuits (e.g., chips) that tend to run hot and are not subject to condensation issues. Those chips are strategically positioned at the border to heat the border and slow thermal conduction from a remainder of the outer zone 110. As mentioned above, reducing thermal conductivity from the outer zone will raise the temperature (e.g., reduce the temperature drop) experienced by the remaining non-cold electronic components 112.

Alternatively or additionally, the additional strategic electronic components 128 can be dedicated sacrificial components that don't serve any other function besides heat generation at the boundary between the intermediate zone 108 and the outer zone 110. Operation of the additional strategic electronic components 128 will generate heat that warms the bridge 122 circuit board material. Warming the bridge 122 circuit board material will slow thermal conduction from the outer zone 110 and will raise the temperature (e.g., reduce the temperature drop) experienced by the remaining non-cold electronic components 112.

FIG. 1D shows system 100D that is similar to system 100C of FIG. 1C. In this case, a cold recovery system 130 is employed relative to the intermediate zone 108. For instance, the cold recovery system 130 can entail a heat exchanger 132 that captures wasted cold from the intermediate zone 108, such as by flowing a fluid proximate to the intermediate zone. The wasted cold will cool the fluid. The cooled fluid can then be used to cool other electronic components, such as intermediate temperature chips 134 to maintain them in a desired temperature range. Thus, the non-cold electronic components 112 on the outer zone 110 do not get too cold and the intermediate temperature chips 134 do not get too hot.

Figure 2B:
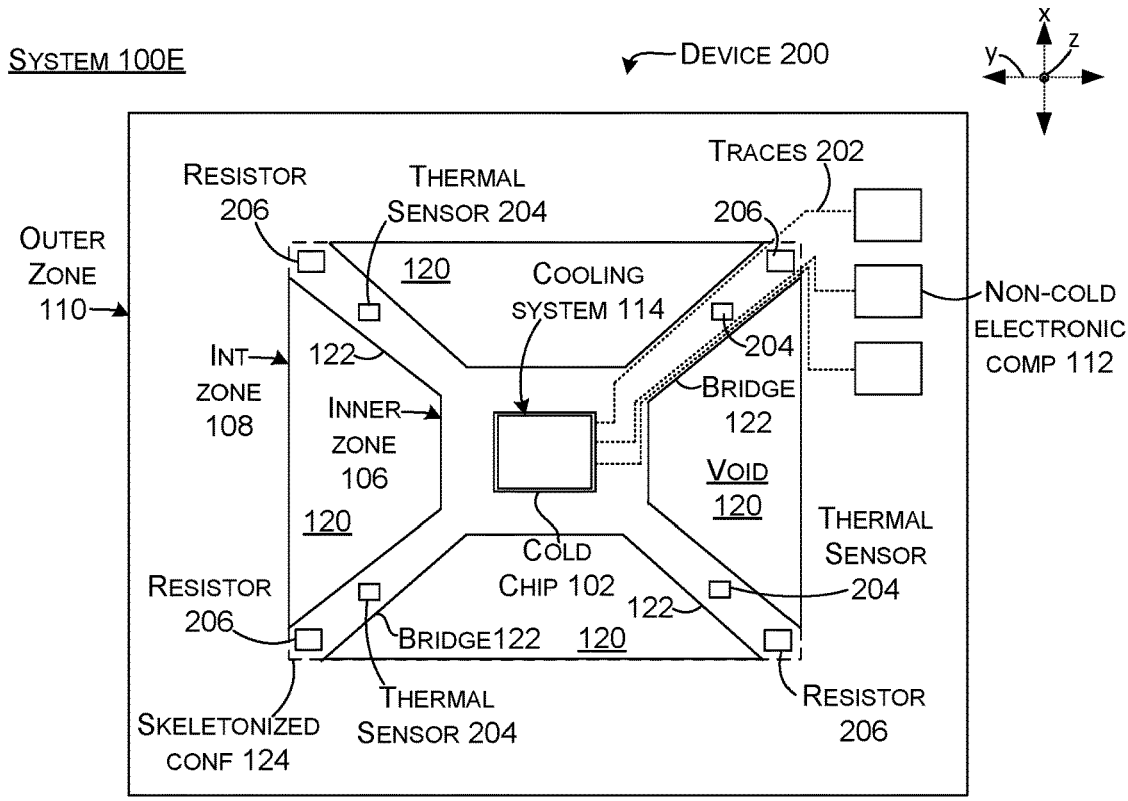
FIG. 2B shows an elevational view of an example thermal management system in accordance with some implementations of the present concepts.

FIGS. 2A and 2B collectively show an example system 100E that includes an example device 200 that is consistent with the present thermal management concepts introduced above. For instance, the device 200 can be a server or other computing device. In this case, the circuit board 104 is (generally) planar in the xy reference plane. The circuit board has upper and lower opposing major surfaces that define a thickness therebetween (e.g., in the z reference direction). Four voids 120 are defined between four bridges 122. The bridges 122 extend from the outer zone 110, across the intermediate zone 108, to the inner zone 106. Various electrically conductive traces 202 extend across the bridges 122 to electrically connect the cold chip 102 to non-cold electronic components 112 and/or to power the cold chip 102. For instance, the electrically conductive traces 202 can include power lines and/or data lines. The electrically conductive traces 202 can be positioned on the major surfaces and/or within the circuit board material 118 (e.g., between layers of substrate material).

In this implementation, a thermal sensor or temperature sensor 204 is positioned on each bridge 122. Additional strategic electronic components 128 are positioned proximate to where the bridges 122 reach the outer zone 110. In this case the additional strategic electronic components 128 are manifest as heaters, such as resistors 206. The resistors 206 can be selectively powered to generate heat. In this implementation, control of the resistors can be based upon one or more parameters, such as temperatures sensed by the thermal sensors 204. For example, if the temperature sensed by an individual thermal sensor 204 on an individual bridge 122 falls below a threshold, the associated individual resistor 206 can be powered to generate heat. The heat generated by the resistor 206 can be absorbed by circuit board material of the individual bridge and thus heat the individual bridge. Heating the individual bridge can reduce cooling of the outer zone 110 along the individual bridge 122.

In some configurations, control of the resistor 206 can be binary; either on or off. For instance, if the temperature sensed by an individual thermal sensor 204 on an individual bridge 122 falls below the threshold, the associated individual resistor 206 can be powered on to generate heat until the threshold temperature is met. In other configurations, the resistor can be controlled at one of multiple different power values. For instance, if the sensed temperature of the bridge drops below the threshold, the resistor may be powered at a first lower value for a period of time. If the sensed temperature of the bridge does not reach the threshold or continues to drop, the resistor can be powered at a second higher value, etc. This configuration can allow fine tuning through feedback provided by the temperature sensor so that the resistor is powered just enough to maintain the threshold temperature.

In this implementation, the resistors 206 are components that are dedicated to thermal management and do not contribute to other functions of the system 100E. In other implementations, the additional strategic electronic components 128 may also contribute to other functionalities. Examples of this latter configuration are described below relative to FIGS. 5A-5C.

Recall that the intermediate zone 108 entails alternating voids 120 and bridges 122. This configuration provides a technical solution of reducing the heat load that migrates from the outer zone 110 through the intermediate zone 108 to the inner zone 106. The voids 120 serve to reduce the amount of substrate material in the intermediate zone through which thermal energy can migrate, while the bridges 122 provide structural integrity to the circuit board 104 and paths for the traces 202. Thus, from one perspective, the alternating bridges 122 and voids 120 can be viewed as a 'skeletonized' configuration 124 of intermediate zone 108. The skeletonized configuration 124 provides a technical solution of structural integrity with a reduced thermal heat load. The voids 120 can be occupied by air or filled with a thermal insulation, such as thermal foam. The voids 120 can extend part way or all the way through the circuit board in the z reference direction.

In the illustrated configuration of FIGS. 2A and 2B, the intermediate zone 108 approximates a rectangle with the bridges 122 extending from the corners of the rectangle. This configuration provides longer paths for thermal migration along the bridges 122 than other configurations, such as with the bridges intersecting the sides of the rectangle and the voids at the corners of the rectangle.

Figure 3:
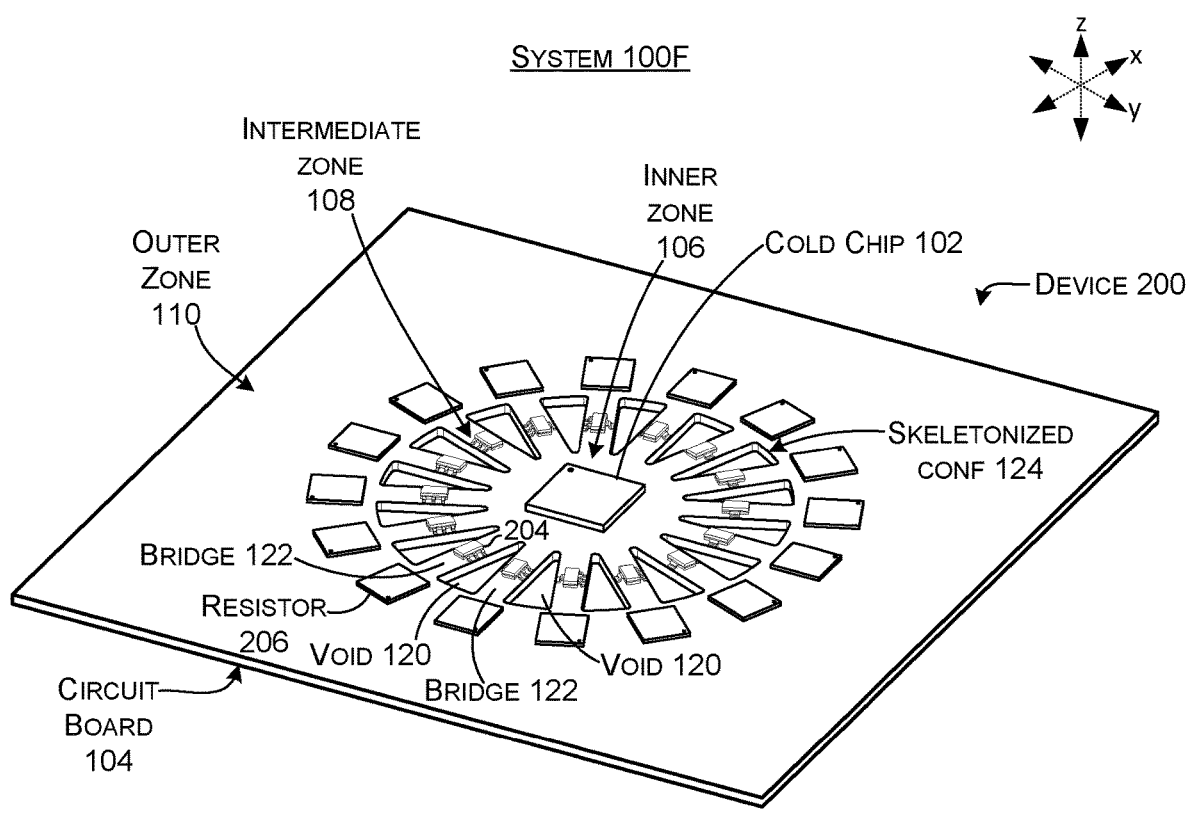

FIG. 3 shows another example system 100F that includes another example device 200 that is consistent with the present thermal management concepts. In this case, circuit board 104 includes intermediate zone 108 that entails sixteen alternating bridges 122 and voids 120 in a skeletonized configuration 124. Not all of the bridges and voids are labelled to avoid clutter on the drawing page. In this case, the alternating bridges 122 and voids 120 are arranged radially around the inner zone 106 with the cold chip 102 positioned at the focus. The alternating bridges 122 and voids 120 provide a technical solution of slowing thermal migration (e.g., reducing the heat load) from the outer zone 110 to the inner zone 106. Thermal sensors 204 are positioned on the bridges 122. Resistors 206 are positioned (near) where the bridges 122 meet the outer zone 110. The resistors 206 provide a complementary technical solution and can be employed to provide additional heat proximate to the bridges 122 to further decrease cooling of the outer zone 110. As mentioned above relative to FIGS. 2A and 2B, the resistors 206 can be controlled at least in part based upon bridge temperatures sensed by the thermal sensors 204.

In the illustrated configuration, the inner zone 106 and the intermediate zone 108 are concentric with one another and share the focus under the cold chip 102. Other configurations may be offset from one another, such as by 20 percent or more and/or have different shapes. For instance, the inner zone 106 and intermediate zone 108 can both be circular shaped but have different focuses. Alternatively, the inner zone can be circular shaped and the intermediate zone can be rectangular shaped with a common center or offset centers. Alternatively, the inner zone 106 and/or intermediate zone 108 can be other shapes, such as oval, elliptical, oblong, rectangular, or irregular, among others.

Figure 4:
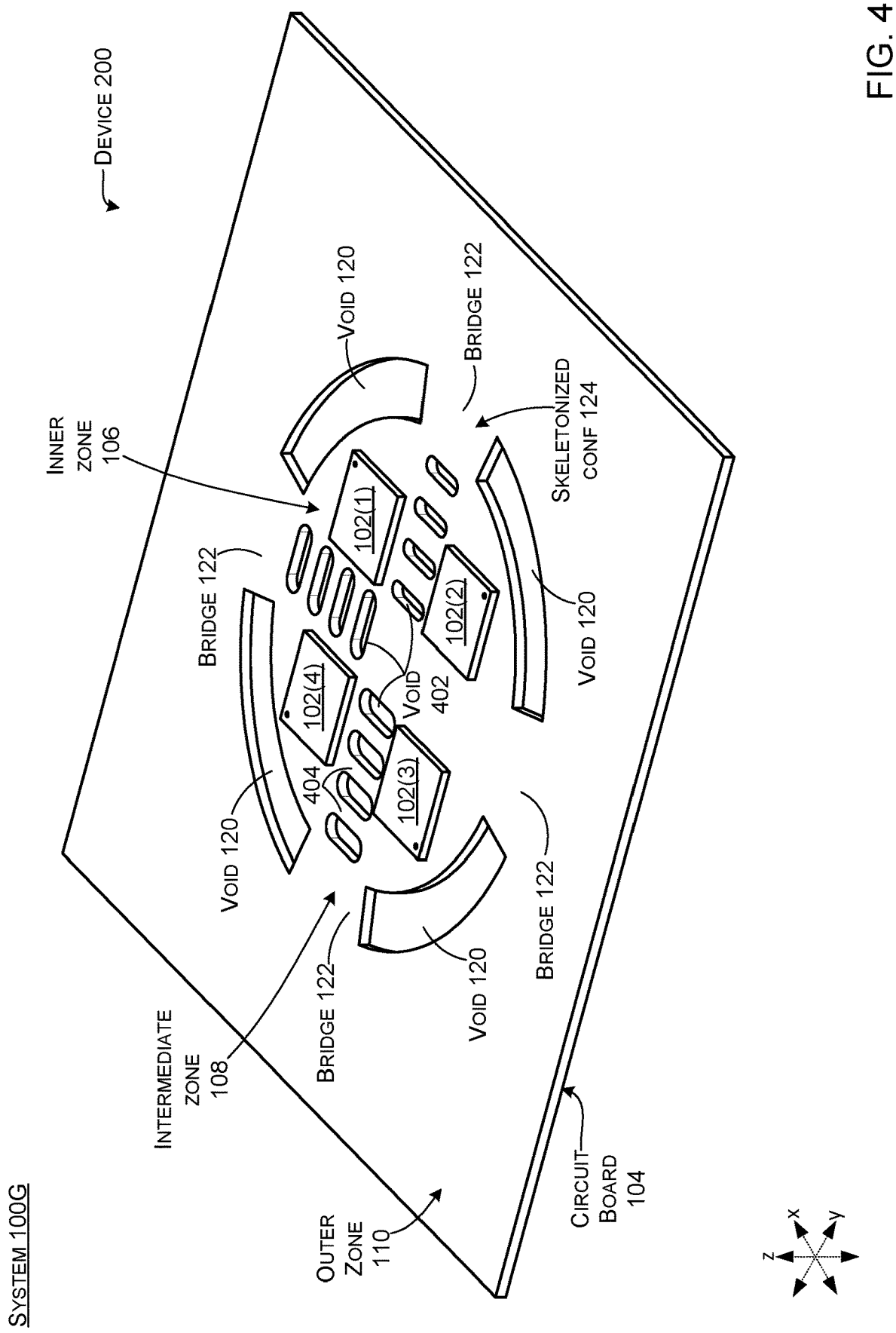

FIG. 4 shows another example system 100G that includes another example device 200 that is consistent with the present thermal management concepts. In this case, circuit board 104 includes intermediate zone 108 that entails four alternating bridges 122 and voids 120 in a skeletonized configuration 124. The inner zone 106 includes multiple cold chips 102. This example includes four cold chips 102(1)-102(4).

In the examples describe above relative to FIGS. 1A-3, the present concepts have been applied to create technical solutions that reduce the rate of thermal migration from the outer zone 110 to the inner zone 106. Note that the present concepts can also provide a technical solution for reducing the rate of thermal migration within the inner zone 106. For instance, assume that in this example the designed operating temperature for cold chip 102(1) is in a range from −220 degrees Celsius (° C.) to −250° C., the designed operating temperatures for cold chips 102(2) and 102(3) are in a range from −180° C. to −200° C., and the designed operating temperature for cold chip 102(4) is in a range from −130° C. to −150° C. In one such example, cold chip 102(1) could be an overclocked central processing unit (CPU), cold chips 102(2) and 102(3) could be overclocked graphics processing units (GPUs), and cold chip 102(4) could be a standard operating GPU, for example.

Voids 402 and bridges 404 are employed on circuit board material of the inner zone 106. Not all instances of the voids 402 and the bridges 404 are labelled to avoid clutter on the drawing page. The voids 402 and bridges 404 are employed between individual cold chips 102 that have different operating temperatures to slow thermal migration. In this example, the voids 402 and bridges 404 are employed between cold chips 102(1) and 102(4), between cold chips 102(1) and 102(2), and between cold chips 102(3) and 102(4) to reduce thermal migration and the likelihood of an individual cold chip dropping below its designed operating temperature range due to thermal migration. In this example, cold chips 102(2) and 102(3) have the same designed operating temperature range and as such no voids 402 and bridges 404 are employed between them.

Figure 5A:
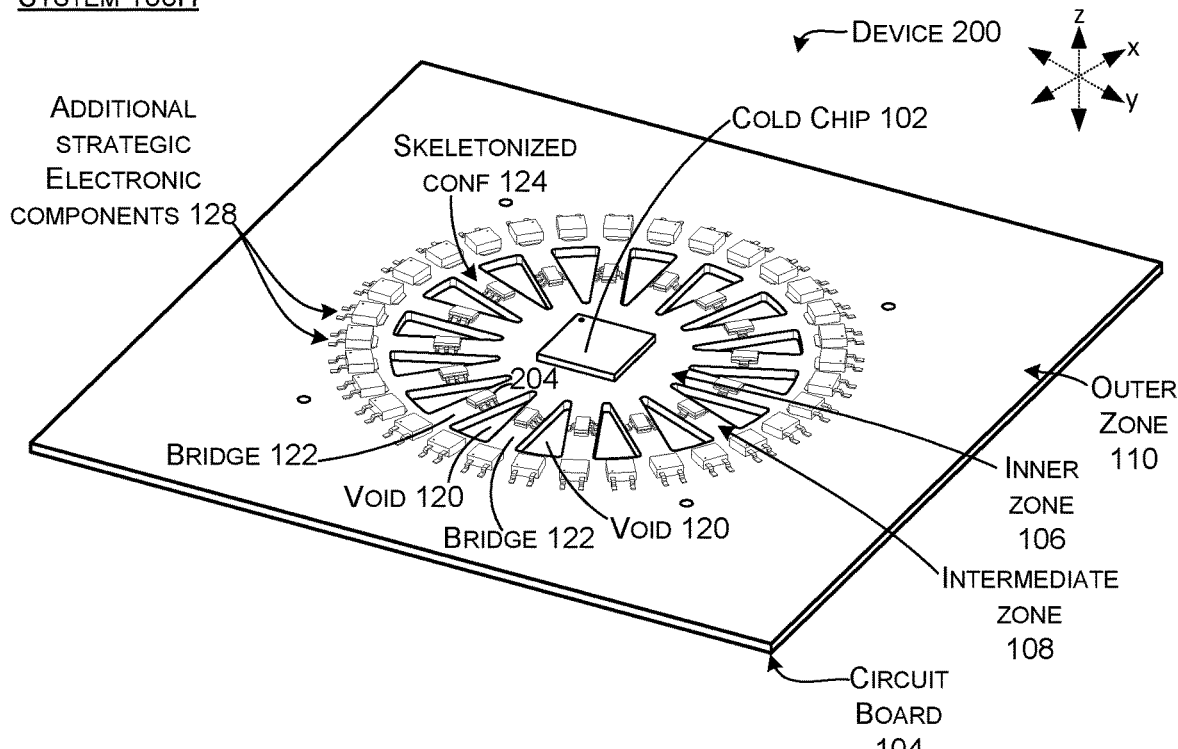
Figure 5B:
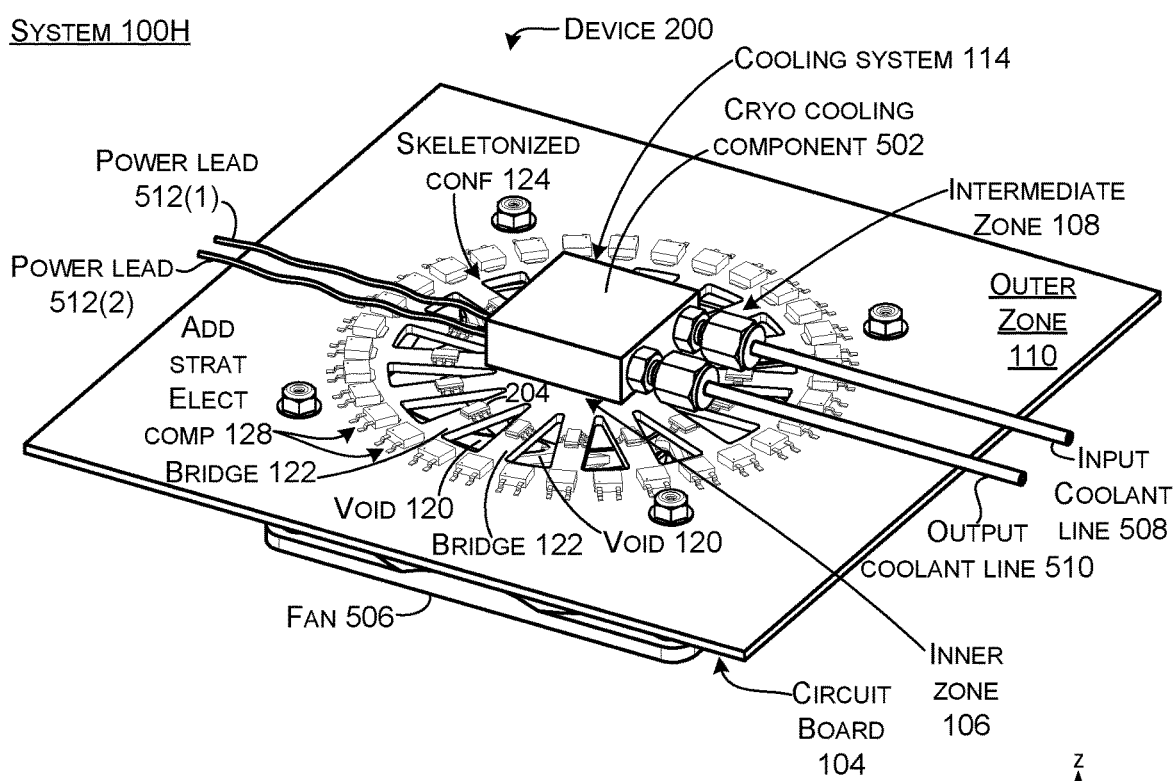
Figure 5C:
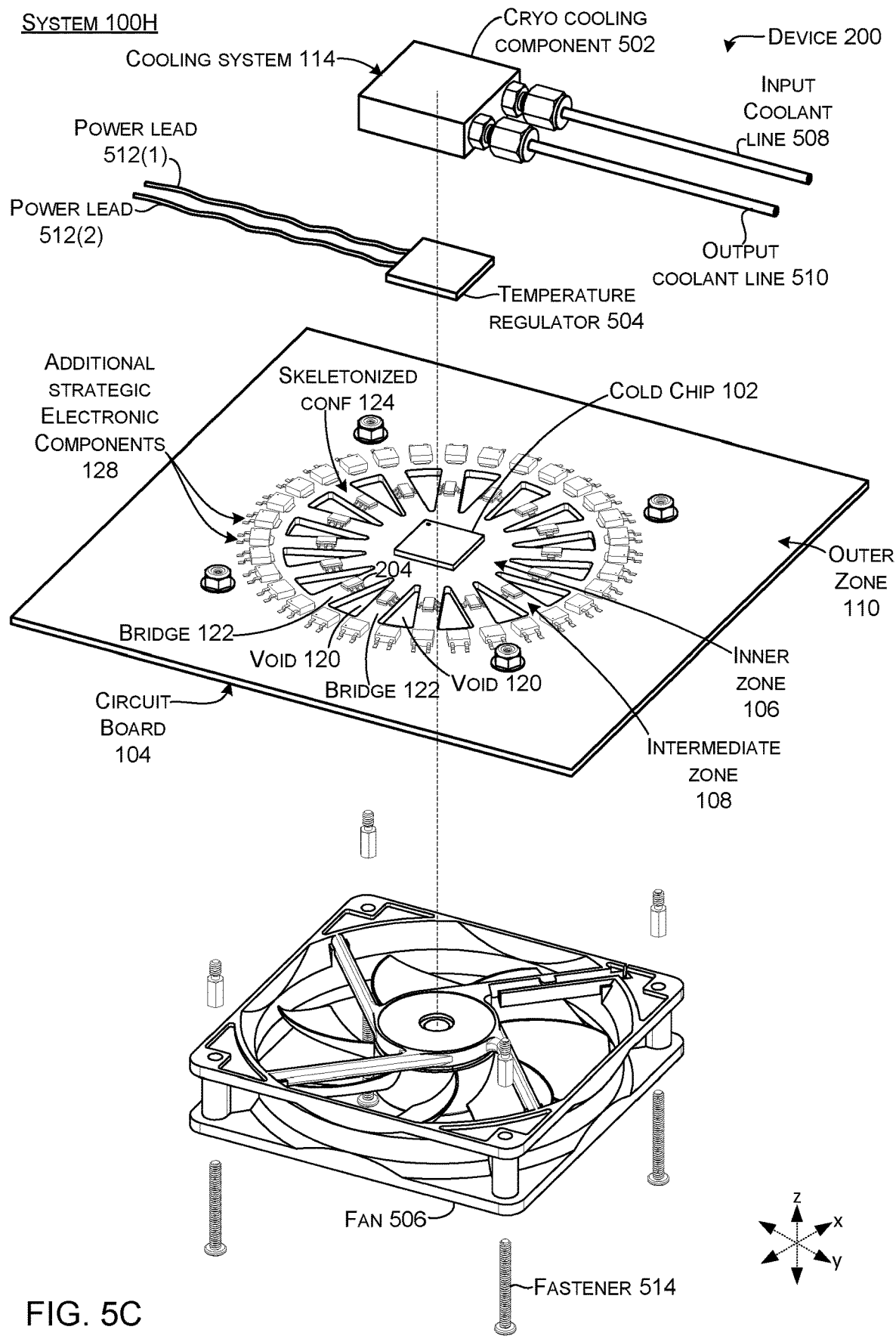
FIGS. 5C, 6, 7, and 8 show exploded perspective views of example thermal management systems in accordance with some implementations of the present concepts.

FIGS. 5A-5C collectively show another example system 100H that includes another example device 200 that is consistent with the present thermal management concepts. FIG. 5A shows the circuit board 104 in isolation. FIG. 5B shows the circuit board assembled with the cooling system 114. FIG. 5C shows an exploded view of the circuit board assembly of FIG. 5B.

As visible in FIG. 5A, this implementation includes sixteen alternating voids 120 and bridges 122 that are radially arranged around the cold chip 102. This implementation includes two additional electronic components 128 per bridge 122. As mentioned above, the additional electronic components 128 can be dedicated components that are employed strictly to provide heat and do not otherwise contribute to functionality of the circuit board. Alternatively, the additional electronic components 128 can be selected from components on the circuit board that tend to regularly be powered on and generate heat. For instance, transformers, converters, voltage regulators, and other power conditioners are often employed to create desired power profiles. These components can be positioned proximate to the bridges to provide their power conditioning functionality and the heating functionality. As an additional option, the illustrated implementation can employ one dedicated additional electronic component 128 and one multifunction additional electronic component 128 per bridge 122. For instance, one additional electronic component 128 can be a dedicated resistor and the other can be a dual function transformer. Normal functioning of the transformer may maintain the temperature of the associated individual bridge 122 (as measured by the associated individual thermal sensor 204) above the threshold. If the bridge temperature falls below the threshold, the dedicated resistor can be activated to generate additional heat.

FIGS. 5B and 5C show the circuit board 104 as an assembly with a cryogenic (e.g., cryo) cooling component 502, a temperature regulator 504 (visible in FIG. 5C), and a fan 506. The cryogenic cooling component 502 is positioned proximate to, and in heat receiving relation with, the cold chip 102. In this case the cold chip 102 can be a cryogenic cold chip (e.g., a cold chip with an operating temperature range between negative 250 degrees C. and negative 150 degrees C., for instance). The cryogenic cooling component 502 can cool the cold chip to maintain the cold chip in the cryogenic operating temperature range. The cryogenic cooling component 502 is fluidly coupled to an input coolant line 508 and an output coolant line 510. The cryogenic cooling component 502, input coolant line 508, and output coolant line 510 are part of the cooling system 114 introduced relative to FIGS. 1A-1D. The temperature regulator 504 is coupled to power leads 512.

In this case, the cryogenic cooling component 502 is positioned above the cold chip 102 with the temperature regulator 504 positioned between them. In this implementation, the cryogenic cooling component 502 is positioned against the temperature regulator 504 which is positioned against the cold chip 102. The temperature regulator 504 can provide precise temperature regulation of the cold chip. For instance, the temperature regulator 504 can entail a Peltier device that can be controlled to adjust the rate of thermal transfer between the cold chip 102 and the cryogenic cooling component 502 to maintain the cold chip in the designed/desired operating range. In another example the temperature regulator 504 can be implemented as a resistive heater. The resistive heater can be selectively activated to generate heat and thereby incrementally increase the temperature of the cold chip 102 compared to the temperature of the cryogenic cooling component 502.

In this implementation, the voids 120 pass entirely through the circuit board material in the z reference direction. The fan 506 is secured to the circuit board 104, such as with fasteners 514. The fan 506 can be selectively controlled to force air through the voids 120 (e.g., past the bridges 122) in the z reference direction. For instance, the fan 506 can be powered on whenever cryogenic cooling component 502 is operating. Alternatively or additionally, the fan power level can be controlled based at least in part upon the sensed temperature of the bridges 122. For example, if the bridge temperature drops below the threshold, the fan can be operated until the sensed bridge temperatures satisfy the threshold. The fan control can be 'on' and 'off' or include multiple speeds. For instance, the fan control can include a fast speed if the bridge temperature drops below the threshold and then a slower or maintenance speed once the threshold is met.

In this configuration, the fan 506 is an axial fan with a shaft orientated in the z reference direction, fan blades are oriented radially around the shaft. Rotation of the shaft causes the fan blades to create axial air flow along (e.g., parallel to) the shaft in the z reference direction. Other fan configurations are described below relative to FIGS. 9A, 9B, 10, and 12.

In this case, in system 100H the ambient air can be warmer than the cryogenic cooling component 502, the cold chip 102, and the circuit board material of the inner zone 106. The airflow created by the fan 506 through the voids 120 and around the bridges 122 can warm the bridges and reduce temperature drop on the outer zone 110. Reducing temperature drop on the outer zone reduces temperature drop of non-cold electronic components 112 (shown FIGS. 2A and 2B) positioned on the outer zone 110. In this case, the non-cold electronic components 112 are non-cryo electronic components that have operating temperature ranges from 30 degrees C. to 100 degrees C., for instance. The present concepts provide technical solutions that allow the (cryo) cold chip 102 to operate in the cryogenic operating temperature range and the (non-cryo) non-cold electronic components 112 to operate in their operating temperature range.

Figure 6:
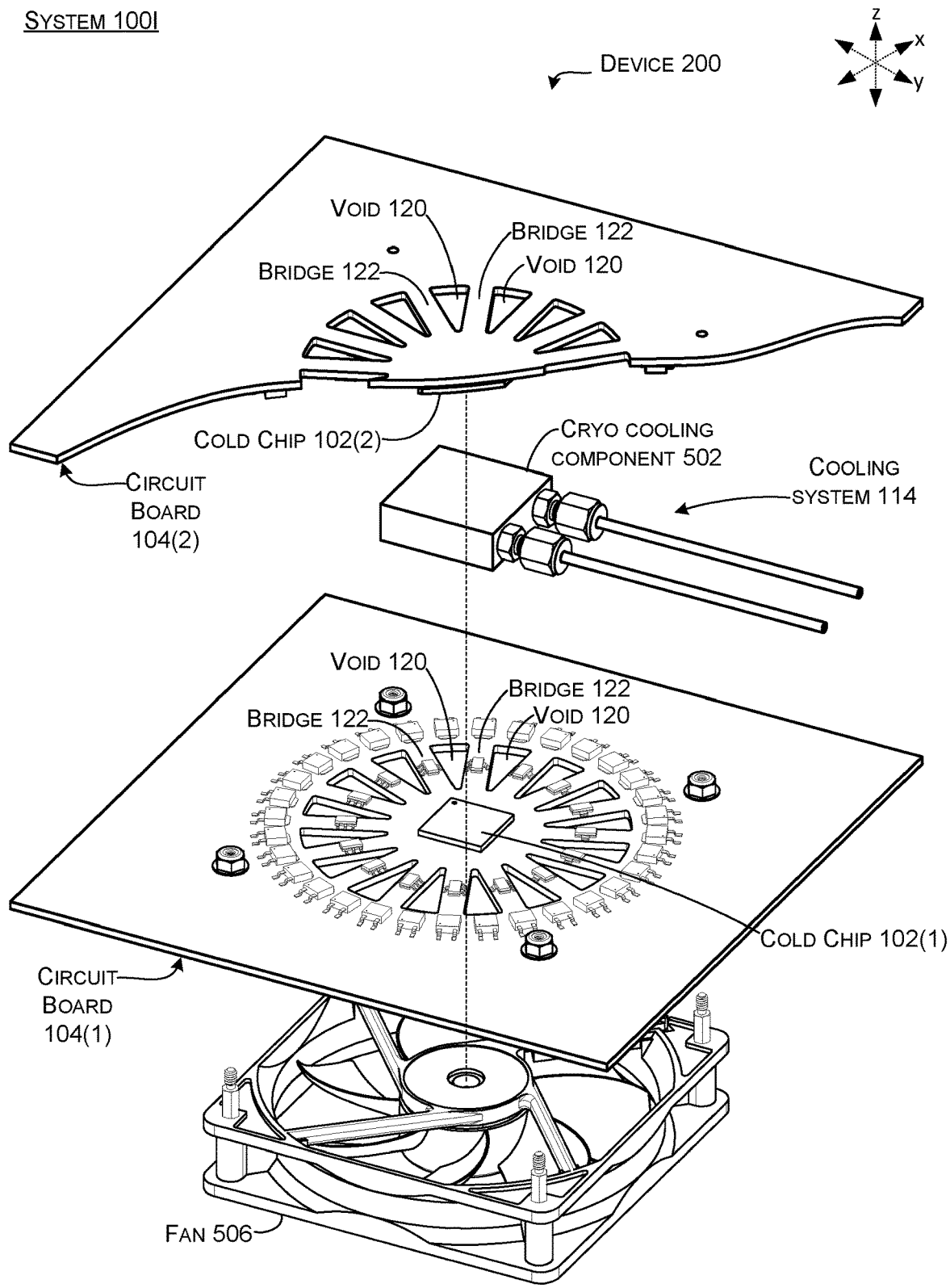

FIG. 6 shows another system 100I that includes another example device 200 that is consistent with the present thermal management concepts. System 100I is similar to system 100H of FIGS. 5A-5C. However, this implementation employs multiple circuit boards stacked in the z reference direction. In this example, circuit board 104(1) is oriented the same as circuit board 104 of FIGS. 5A-5C with cold chip 102(1) facing upwardly (in the positive z reference direction) on the drawing page. Another circuit board 104(2) (shown partially cutaway) is inverted so that cold chip 102(2) is facing downwardly (e.g., in the negative z reference direction). The cryogenic cooling component 502 is sandwiched between the cold chips 102(1) and 102(2). Thus, one cryogenic cooling component 502 can service two cold chips 102(1) and 102(2) on two separate circuit boards 104(1) and 104(2).

In an alternative configuration circuit boards 104 and cryogenic cooling components 502 can be stacked in an alternating one-to-one ratio. In still another configuration, cold chips 102 could be positioned on each major side of the circuit boards 104 with cryogenic cooling components 502 positioned between circuit boards. Thus, the stack in the z reference direction could entail cold chip, circuit board, cold chip, cryogenic cooling component, cold chip, circuit board, cold chip, cryogenic cooling component, etc. In any of these configurations, the bridges 122 and the voids 120 of each circuit board 104 can be aligned with the bridges 122 and the voids 120 of each overlying and/or underlying circuit board 104 to allow the fan 506 to effectively blow air through the voids of multiple stacked circuit boards 104.

Figure 7:
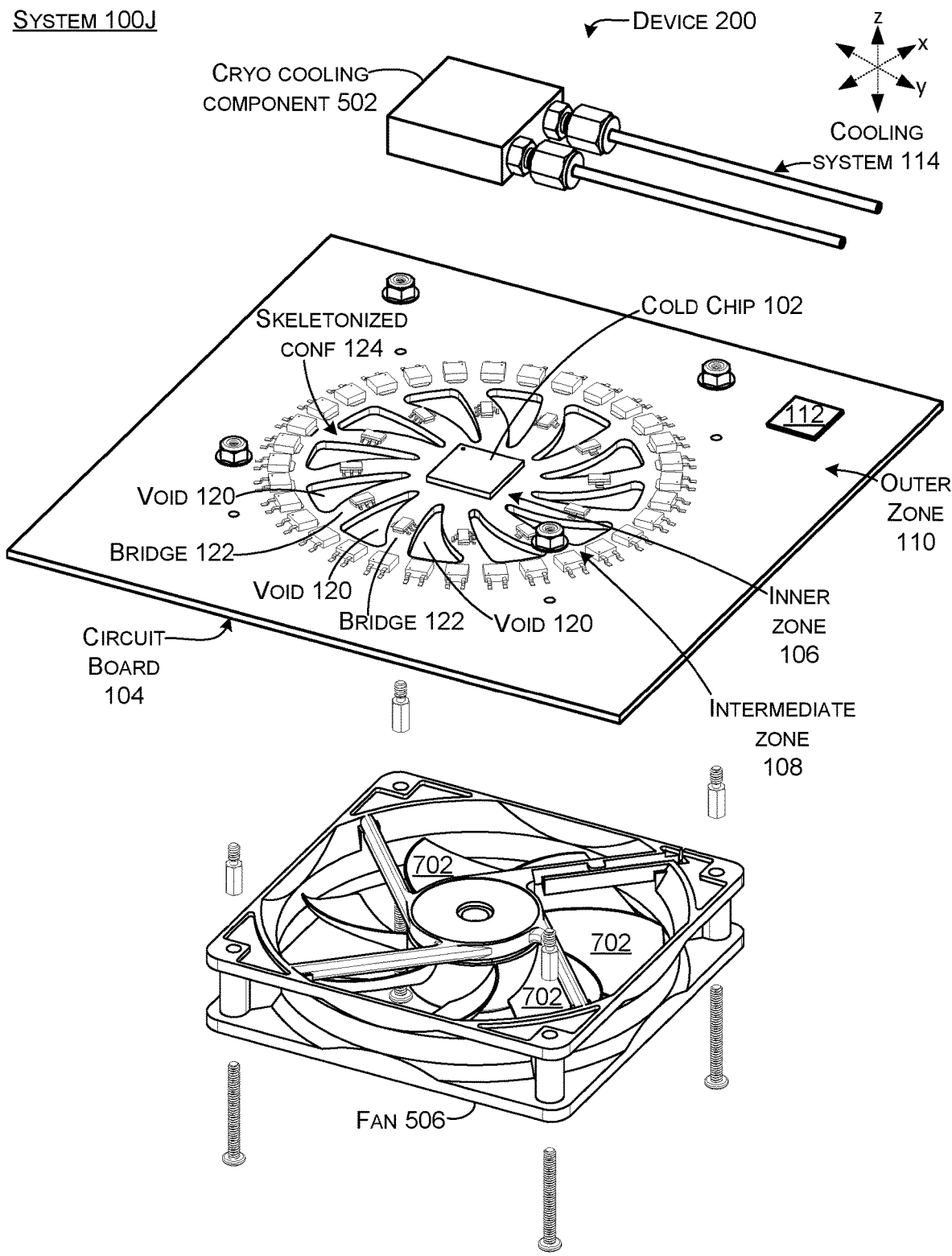

FIG. 7 shows another system 100J that includes another example device 200 that is consistent with the present thermal management concepts. System 100J is similar to system 100H of FIGS. 5A-5C. In this example fan 506 is secured to one side of the circuit board 104. The cold chip 102 is positioned on the inner zone 106 on the opposite side of the circuit board 104. The cryogenic cooling component 502 is positioned against the cold chip 102. Alternating voids 120 and bridges 122 extend from the outer zone 110 across the intermediate zone 108 to the inner zone 106 in skeletonized configuration 124. In this case, the voids 120 are curved and have an asymmetrical shape when viewed along the z reference axis. In this configuration, the distal end (e.g., away from the cold chip 102) is wider than the proximal end (e.g., toward the cold chip). The curved asymmetrical shape can approximate a shape of the fan blades 702. For a given fan design, voids 120 that approximate the shape of the fan blades can facilitate airflow through the voids 120. Facilitating airflow can increase thermal transfer between the air moved by the fan 506 and the bridges 122. For example, the air the fan 506 moves through the curved voids 120 and past the bridges 122 can be warmer than the inner zone 106 and can warm the bridges 122. Warming the bridges 122 can reduce temperature drop of the outer zone 110 and non-cold electronic components 112 positioned on the outer zone.

Figure 8:
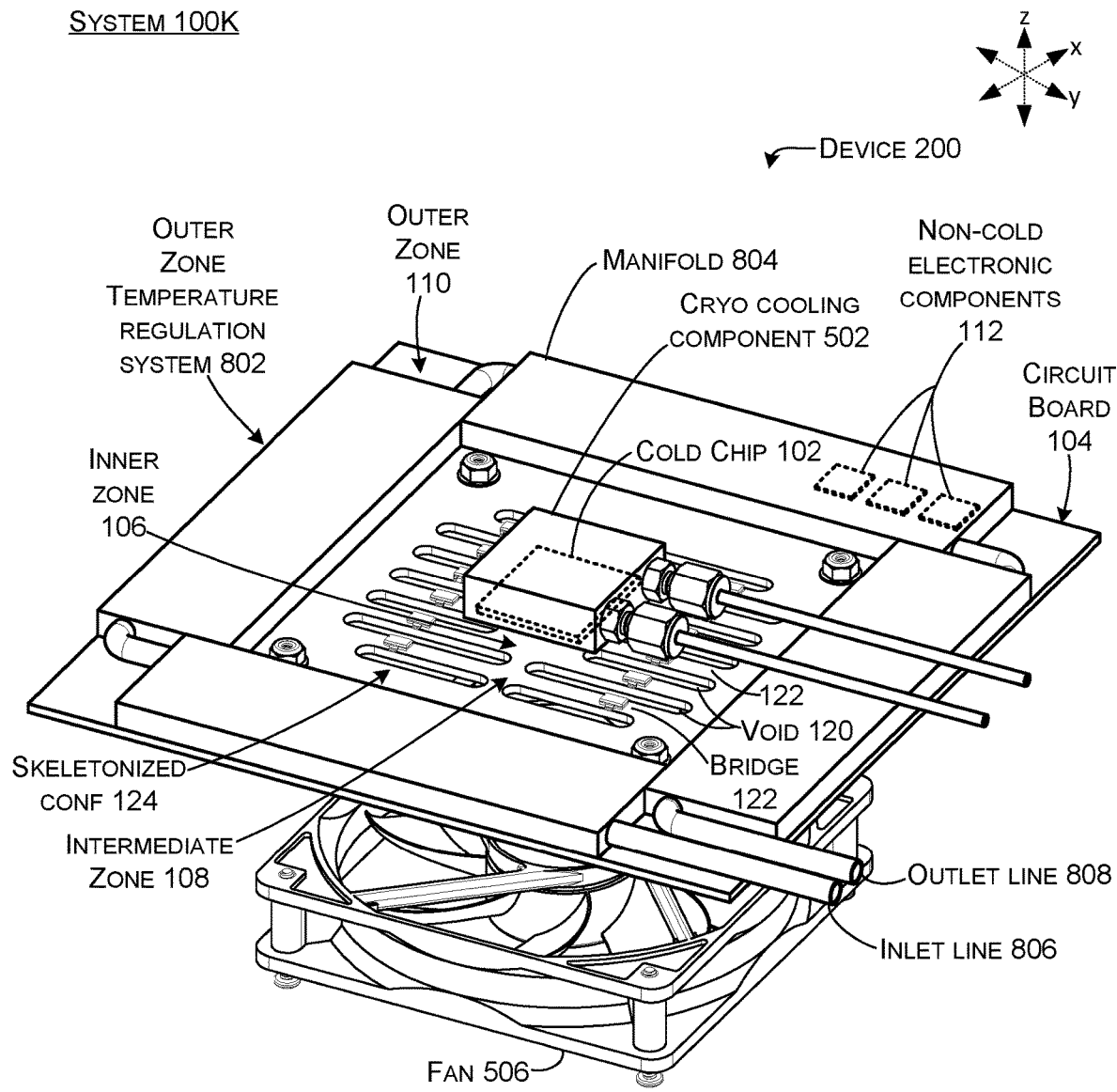

FIG. 8 shows another system 100K that includes another example device 200 that is consistent with the present thermal management concepts. In this case, the voids 120 and bridges 122 of the intermediate zone 108 create skeletonized configuration 124. The voids 120 and bridges 122 are oriented parallel to one another and are positioned around the inner zone 106. The cold chip 102 of the inner zone 106 is shown in ghost to indicate that it is obscured by the cryogenic cooling component 502.

System 100K also includes an outer zone temperature regulation system 802. The outer zone temperature regulation system 802 includes manifolds (e.g., cold plates) 804 positioned on outer zone 110 over the non-cold electronic components 112. Inlet line 806 brings fluid into outer zone temperature regulation system 802. The fluid passes through the manifolds 804 and eventually leaves the outer zone temperature regulation system 802 via the outlet line 808. The outer zone temperature regulation system 802 can be used to control the temperature of the outer zone 110 (and the non-cold electronic components 112). The temperature control can include heating or cooling depending at least in part upon the temperature of the outer zone 110 and the designed/desired operating temperature of the non-cold electronic components 112. Waste cold, picked up by fluid flowing through manifolds 804, could be reused for cooling of other components. Thus, the outer zone temperature regulation system 802 provides another mechanism for operating the cold chip 102 on the same circuit board as the non-cold electronic components 112 without subjecting the non-cold electronic components 112 to damaging condensation. In this system configuration, the voids 120 and the bridges 122 of the intermediate zone 108 alone or in combination with the outer zone temperature regulation system 802 can allow the cold chip 102 to operate at very low temperatures, while allowing the non-cold electronic components 112 of the outer zone 110 to be operated at temperatures above the ambient dew point.

In system 100K fan 506 is an axial fan that is positioned below the circuit board 104 and blows air axially along the z reference axis through the voids 120. An alternative configuration is described below relative to FIGS. 9A and 9B.

Figure 9A:
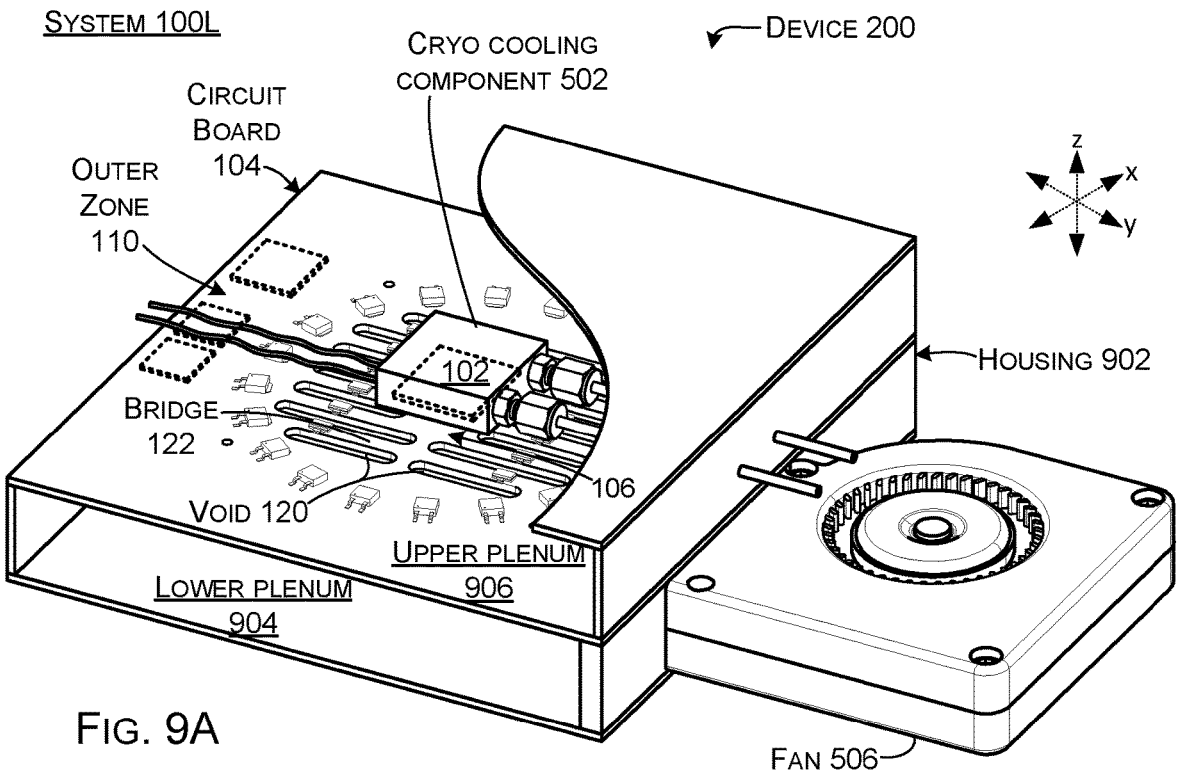
Figure 9B:
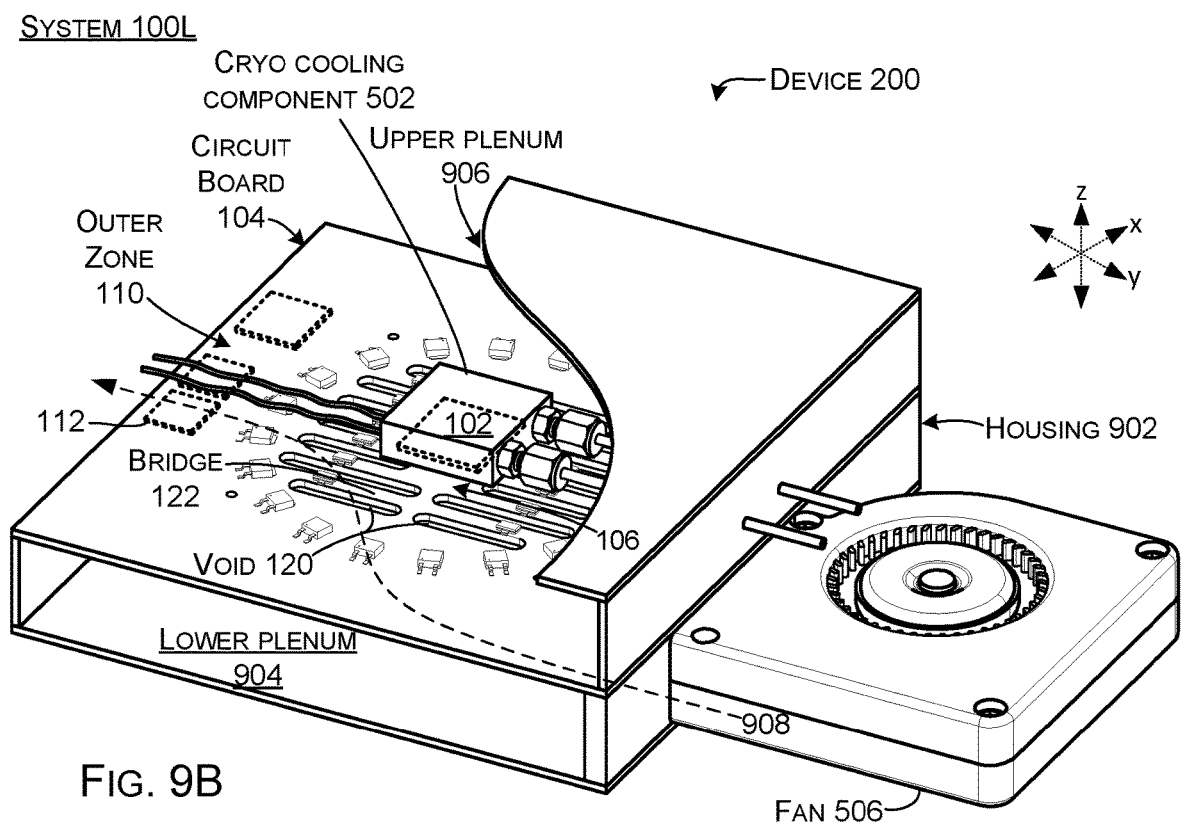

FIGS. 9A and 9B collectively show another system 100L that includes another example device 200 that is consistent with the present thermal management concepts. The cryogenic cooling component 502 is positioned on and is occluding the view of the cold chip 102 which is positioned on the inner zone 106 of the circuit board 104.

System 100L includes a housing 902 that allows fan 506 to be positioned off axis (e.g., not axially aligned with the cold chip 102). In this case, the circuit board 104 is positioned in the housing 902 between a lower plenum 904 and an upper plenum 906 (shown partially cutaway). The fan 506 can be manifest as a radial fan or a squirrel cage fan, among others. As shown in FIG. 9B by arrow 908, the fan 506 blows air into the lower plenum 904. The air flows through the voids 120 and between the bridges 122 to reach the upper plenum 906. The air can be directed out of the upper plenum 906. The airflow can be used to heat or cool the bridges 122. For instance, warmer ambient airflow can raise the temperature of the bridges 122 and thus decrease cooling of the outer zone 110. In this case, the airflow in the upper plenum is directed over non-cold electronic components 112 and then out of the upper plenum.

Figure 10:
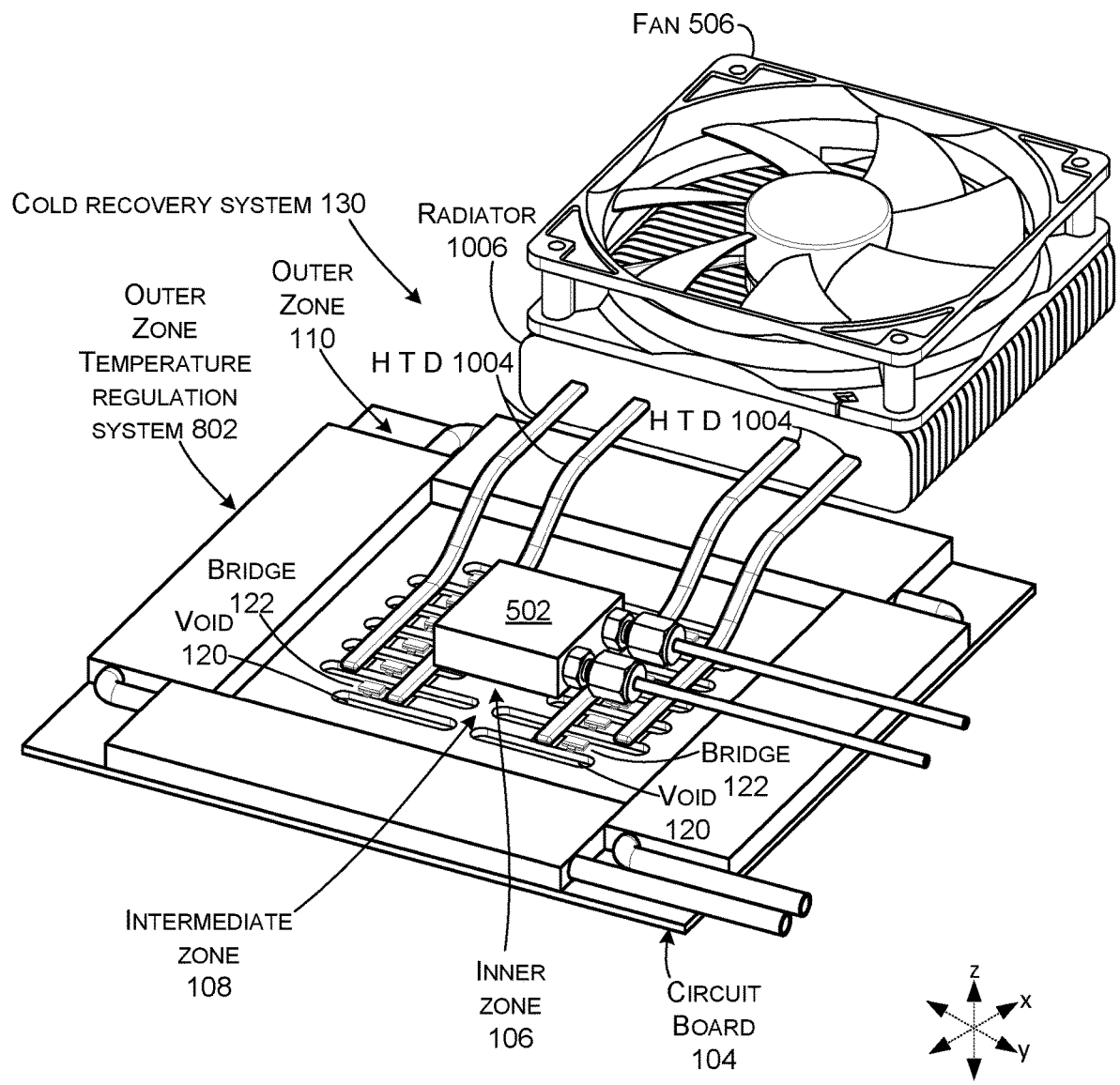

FIG. 10 shows another system 100M that includes another example device 200 that is consistent with the present thermal management concepts. This implementation includes the outer zone temperature regulation system 802 introduced above relative to FIG. 8. This implementation also includes cold recovery system 130.

Recall that the cold chip 102 on the inner zone 106 requires cold operating temperatures and the cryogenic cooling component 502 can maintain these cold temperatures. However, traditionally the cold can bleed from the inner zone 106 into the surrounding circuit board material of the intermediate zone 108 and ultimately the outer zone 110. Not only is this cold 'wasted' from an energy standpoint, but it can also cool non-cold electronic components on the outer zone 110 and cause them to be damaged, such as from condensation as described above. The voids 120 and bridges 122 of the intermediate zone 108 provide a technical solution that reduces this cold bleeding (or heat migration in the opposite direction) and protects the non-cold components 112 of the outer zone 110. The cold recovery system 130 provides a further technical solution of recovering or salvaging unwanted 'waste' cold from the intermediate zone 108 and allowing the waste cold to be utilized to cool other areas of the device 200 and/or system 100M. For example, the cold recovery system 130 can allow the waste cold to be utilized to cool other areas of the circuit board 104 and/or other areas of the device 200 and/or system 100M that are external to the circuit board 104.

In the illustrated configuration, cold recovery system 130 entails a heat transfer device 1004 that extends from the intermediate zone 108 to a radiator 1006. The heat transfer device 1004 and/or radiator 1006 can function as heat exchanger 132 discussed in relation to FIG. 1D. In this case, four heat transfer devices 1004 are illustrated, though other numbers can be employed. The heat transfer device 1004 can be manifest as a high efficiency thermal conductor, such as a length of copper or graphene. Alternatively, the heat transfer device 1004 can be manifest as a heat pipe or a vapor chamber.

Waste cold from the intermediate zone 108 can move through the heat transfer device 1004 to the radiator 1006. The fan 506 can blow ambient air through the radiator that is cooled as it passes through the radiator. Cooled air could further be reused for cooling of other components. Stated from a thermodynamic perspective, heat energy captured from ambient air passing through the radiator 1006 can migrate down the heat transfer devices 1004 to the intermediate zone 108. The heat can migrate to the inner zone 106 and be evacuated by the cryogenic cooling component 502. This process slows heat migration from the outer zone 110 to the intermediate zone 108.

Figure 11:
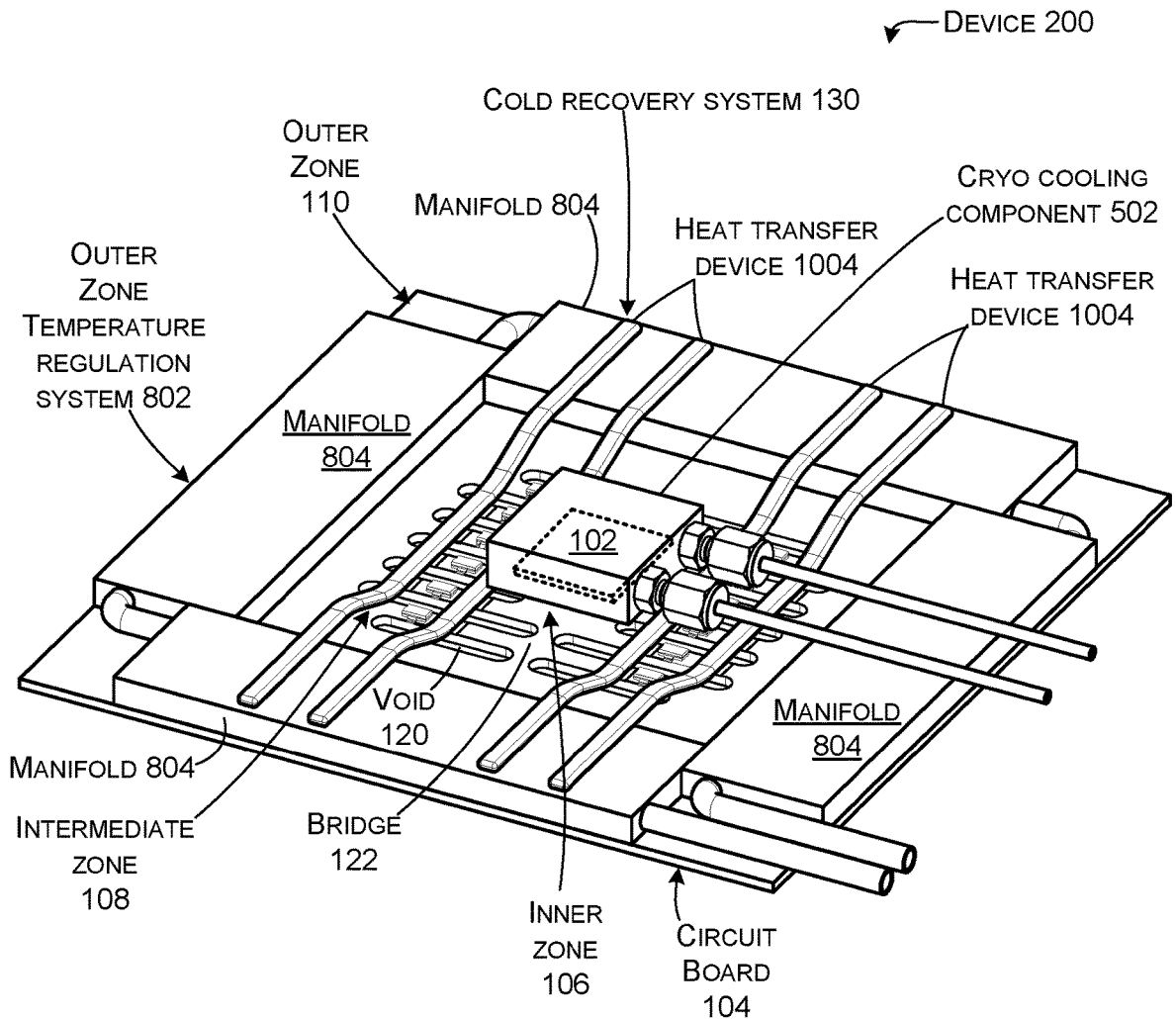

FIG. 11 shows another system 100N that includes another example device 200 that is consistent with the present thermal management concepts. In this case, the cold recovery system 130 includes multiple heat transfer devices 1004. The multiple heat transfer devices 1004 contact the intermediate zone 108 and extend to manifolds 804 of the outer zone temperature regulation system 802. Thus, waste cold from the intermediate zone 108 can be moved to the manifolds 804. The waste cold can be carried by fluid of the outer zone temperature regulation system 802 to cool other components to maintain them in their desired operating temperature ranges.

Figure 12:
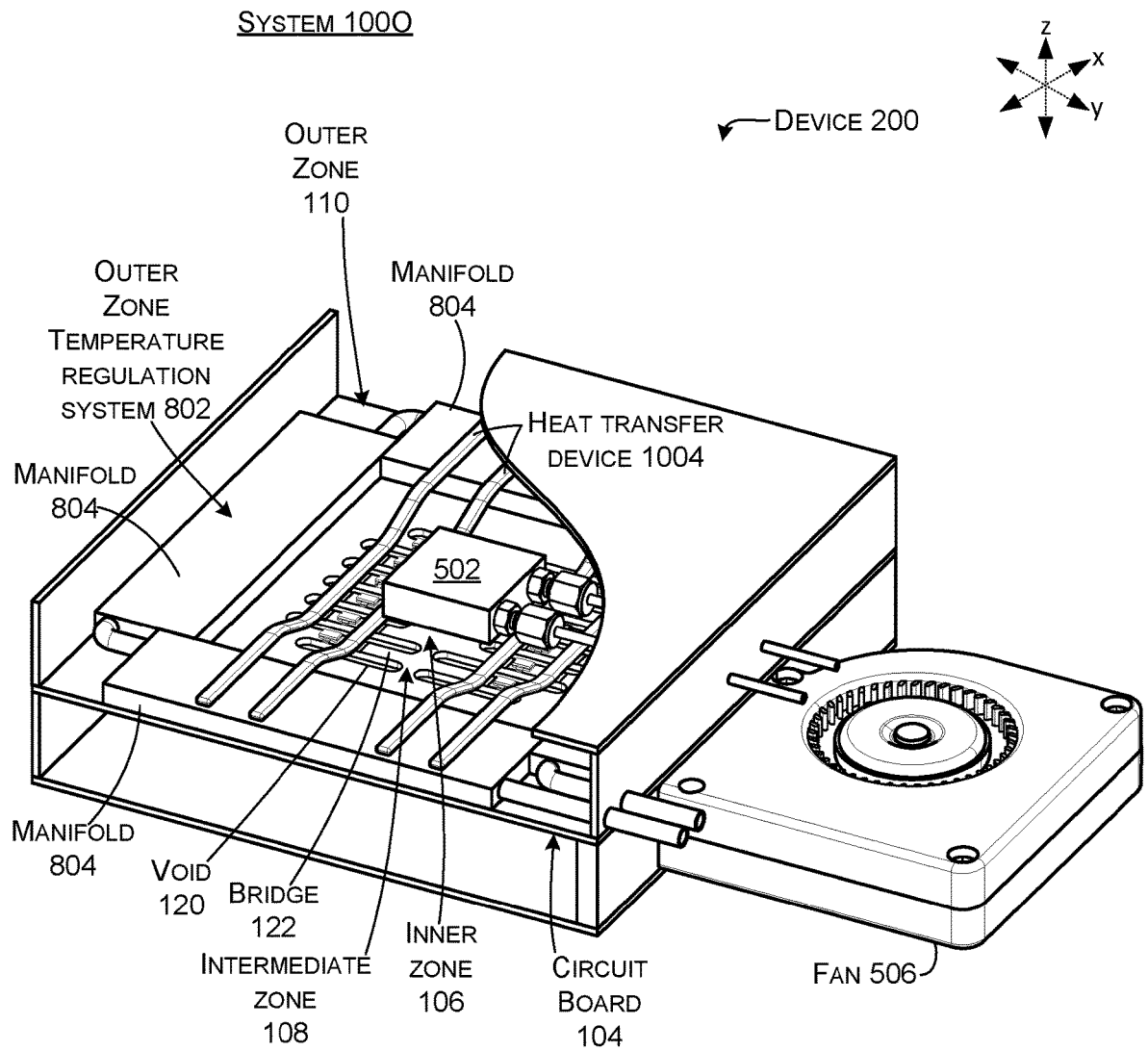

FIG. 12 shows another system 100O that includes another example device 200 that is consistent with the present thermal management concepts. System 100O includes the heat transfer devices 1004 extending from the intermediate zone 108 to the manifolds 804 as described in FIG. 11. System 100O also supplies airflow through the voids 120 from one side of the circuit board 104 to the other via the radial fan 506 and housing 902 introduced in FIG. 9A. Thus, this combination provides a technical solution of reducing temperature drop at the outer zone 110 caused by the cryogenic cooling component 502 on the inner zone 106. Further, excess cooling capacity provided by the cryogenic cooling component 502 (e.g., beyond what is needed to cool the cold chip 102) can be redirected by the fan 506, the heat transfer devices 1004 and the outer zone temperature regulation system 802 to cool other components.

Various examples are described above. Additional examples are described below. One example includes a system comprising a circuit board including inner, intermediate, and outer generally concentric zones, a cryogenically cooled chip located in the inner zone, non-cryogenic electronic components positioned in the outer zone and the intermediate zone having a skeletonized configuration that slows thermal energy movement from the outer zone to the inner zone.

Another example can include any of the above and/or below examples where the cryogenically cooled chip is positioned at a focus of the inner, intermediate, and outer concentric zones, and wherein the skeletonized intermediate zone includes voids in the circuit board that are radially arranged around the focus.

Another example can include any of the above and/or below examples where the inner, intermediate, and outer zones are concentric, or wherein generally concentric comprises within 20 percent of being concentric.

Another example can include any of the above and/or below examples where the circuit board is planar and the cryogenically cooled chip is positioned on the circuit board and a cryogenic cooling component is positioned over the cryogenically cooled chip and further comprising another circuit board comprising another cryogenically cooled chip positioned opposite to the cryogenically cooled chip in a sandwich configuration around the cryogenic cooling component.

Another example can include any of the above and/or below examples where the skeletonized configuration of the intermediate zone comprises alternating bridge substrate and voids.

Another example can include any of the above and/or below examples where the system further comprises conductive traces extending along the bridge substrate from the outer zone to the cryogenically cooled chip.

Another example can include any of the above and/or below examples where the conductive traces comprise data lines and power lines to the cryogenically cooled chip.

Another example can include any of the above and/or below examples where the conductive traces are positioned on one planar surface of the circuit board, both planar surfaces of the circuit board, and/or within the circuit board.

Another example can include any of the above and/or below examples where the intermediate zone is rectangular shaped and the bridge substrate extends from corners of the rectangular shape.

Another example can include any of the above and/or below examples where the intermediate zone is circular or oval shaped and the bridge substrate extends radially from the outer zone to the inner zone.

Another example can include any of the above and/or below examples where the system further comprises a temperature sensor on the bridge substrate.

Another example can include any of the above and/or below examples where the system further comprises a heater on the bridge substrate.

Another example can include any of the above and/or below examples where the system is configured to activate the heater when a temperature sensed by the temperature sensor on the bridge substrate falls below a threshold.

Another example can include any of the above and/or below examples where the cryogenically cooled chip comprises multiple cryogenically cooled chips that have different operating temperature ranges.

Another example can include any of the above and/or below examples where the inner zone is skeletonized between the multiple cryogenically cooled chips that have different operating temperature ranges.

Another example can include any of the above and/or below examples where the system further comprises a heat transfer device thermally coupled to the skeletonized intermediate zone.

Another example can include any of the above and/or below examples where the heat transfer device is thermally coupled to another location on the circuit board.

Another example can include any of the above and/or below examples where the heat transfer device is thermally coupled external to the circuit board.

Another example includes device comprising a circuit board including an inner zone separated from an outer zone by an intermediate zone, a cold chip located in the inner zone that has an operating temperature below standard temperature, an electronic component positioned in the outer zone that has an operating temperature above standard temperature and the intermediate zone having a skeletonized configuration that slows thermal energy movement from the outer zone to the inner zone to prevent the electronic component of the outer zone from being cooled below the standard temperature.

Another example includes a device comprising a circuit board including an inner zone separated from an outer zone by an intermediate zone, a cold chip located in the inner zone and cooled by a cooling system and the intermediate zone having a skeletonized configuration configured to slow thermal energy movement from the outer zone to the inner zone.

CONCLUSION

Although the subject matter relating to thermal management has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A system, comprising:
a circuit board comprising a substrate having a thickness defined between two major surfaces and including inner intermediate and outer generally concentric zones;
a cryogenically cooled chip located in the inner zone;
non-cryogenic electronic components positioned in the outer zone; and,
the intermediate zone defining voids extending through the thickness interposed between bridges extending from the inner zone to the outer zone to create a skeletonized configuration that slows thermal energy movement from the outer zone to the inner zone.

2. The system of claim 1, wherein the cryogenically cooled chip is positioned at a focus of the inner intermediate and outer concentric zones and wherein the intermediate zone includes the voids in the circuit board that are radially arranged around the focus.

3. The system of claim 1, wherein the inner intermediate and outer zones are concentric or wherein generally concentric comprises within 20 percent of being concentric.

4. The system of claim 1, wherein the circuit board is planar and the cryogenically cooled chip is positioned on the circuit board and a cryogenic cooling component is positioned over the cryogenically cooled chip and further comprising another circuit board comprising another cryogenically cooled chip positioned opposite to the cryogenically cooled chip in a sandwich configuration around the cryogenic cooling component.

5. The system of claim 4, wherein the skeletonized configuration of the intermediate zone comprises alternating bridge substrate and voids.

6. The system of claim 5, further comprising conductive traces extending along the bridge substrate from the outer zone to the cryogenically cooled chip.

7. The system of claim 6, wherein the conductive traces comprise data lines and power lines to the cryogenically cooled chip.

8. The system of claim 7, wherein the conductive traces are positioned on one planar surface of the circuit board, both planar surfaces of the circuit board and/or within the circuit board.

9. The system of claim 8, wherein the intermediate zone is rectangular shaped and the bridge substrate extends from corners of the rectangular shape.

10. The system of claim 8, wherein the intermediate zone is circular or oval shaped and the bridge substrate extends radially from the outer zone to the inner zone.

11. The system of claim 5, further comprising a temperature sensor on the bridge substrate.

12. The system of claim 11, further comprising a heater on the bridge substrate.

13. The system of claim 12, wherein the system is configured to activate the heater when a temperature sensed by the temperature sensor on the bridge substrate falls below a threshold.

14. The system of claim 1, wherein the cryogenically cooled chip comprises multiple cryogenically cooled chips that have different operating temperature ranges.

15. The system of claim 14, wherein the inner zone is skeletonized between the multiple cryogenically cooled chips that have different operating temperature ranges.

16. The system of claim 1, further comprising a heat transfer device thermally coupled to the intermediate zone.

17. The system of claim 16, wherein the heat transfer device is thermally coupled to another location on the circuit board.

18. The system of claim 16, wherein the heat transfer device is thermally coupled external to the circuit board.

19. A device, comprising:
a circuit board extending along a plane and including an inner zone an intermediate zone and an outer zone concentrically arranged around an axis that is perpendicular to the plane;
a cold chip located in the inner zone that has an operating temperature below standard temperature;
an electronic component positioned in the outer zone that has an operating temperature above standard temperature; and,
the intermediate zone having a skeletonized configuration that slows thermal energy movement from the outer zone to the inner zone to prevent the electronic component of the outer zone from being cooled below the standard temperature.

20. A device, comprising:
a circuit board defining a major surface and including an inner zone an intermediate zone and an outer zone arranged along the major surface;
a cold chip located in the inner zone and cooled by a cooling system; and,
the intermediate zone having a skeletonized configuration at the major surface that is configured to slow thermal energy movement from the outer zone to the inner zone.

* * * * *